United States Patent Office 3,215,527

Patented Nov. 2, 1965

3,215,527

METHOD FOR PREPARING CURED POLYMERIC ETCH RESISTS USING A XEROGRAPHIC DEVELOPER CONTAINING A CURABLE POLYMER

Sigurd W. Johnson, Oaklyn, N.J., assignor to Radio Corporation of America, a corporation of Delaware No Drawing. Filed Sept. 2, 1960, Ser. No. 53,609
18 Claims. (Cl. 96—1)

This invention relates generally to improved methods of and materials for the preparation of etch resists and more specifically to improved methods of and materials for preparing etched printing plates and printed circuits.

It is frequently desirable to mask selected areas of surfaces for various purposes. For example, in the printing arts, a typographic printing plate is often prepared by masking selected areas of the surface of a sheet of metal, such as magnesium, zinc, or copper, with an acid or alkali resist and then etching the unmasked areas of the plate to a desired depth. In the electronic arts, etched circuits are commonly prepared by masking selected areas of the surface of a metal-coated dielectric base with a resist and then etching away the unmasked portions of the metal coating.

Photoetching techniques are commonly employed for producing typographic printing plates and printed circuits. In conventional photoetching processes, the object to be etched, usually a metal plate or metal clad substrate, is coated with a photoresist. The photoresist is then exposed to an ultraviolet light image, usually by a contact exposure, until the exposed photoresist is rendered insoluble or "hardened" in the exposed areas. The unexposed photoresist is washed away and the object etched to the desired depth.

Conventional photoresists generally require relatively long exposures to the ultraviolet light image because of the relative insensitivity of available photoresists. Consequently, it becomes a practical necessity to first prepare a permanent, relatively dense, full size transparency of the subject matter to be etched. The transparency must then be held firmly against the photoresist during the relatively long, intense exposure to ultraviolet light to obtain the necessary hardening of the photoresist with a minimum loss in resolution. To accomplish this, photoetchers resort to special vacuum frames for holding the transparency in place, and to intense ultraviolet light sources for exposure. Even so, exposure times of ten minutes or more are common.

It is an object of this invention to provide improved methods of and materials for producing etch resists on etchable surfaces.

It is another object to provide improved methods of and materials for electrophotographically producing etch resists.

It is an additional object to provide improved methods of and materials for producing etched printing plates.

It is a further object to provide improved methods of and materials for producing printed circuits.

It is a still further object to provide improved electrophotographic methods of producing etched printing plates and printed circuits wherein the need for employing relatively insensitive light-hardenable materials is obviated.

These and other objects and advantages are accomplished by this invention which includes methods of processing etchable plates having on one surface thereof a coating comprising an insulating resinous layer which is soluble in a selected solvent. A latent electrostatic image is produced on the coating and is developed with a toner which is insoluble in the selected solvent. The developed toner image is then fused to the coating and the selected solvent is applied to the image bearing coating to remove from the etchable plate all of the coating which is not covered by the toner image. A catalyst capable of promoting curing of the material of the coating is then applied, usually from a liquid dispersion or solution, to the plate and the toner image. Once this is done, the image bearing plate is heated to cure and insolubilize the coating remaining on the plate under the fused toner image to convert it into an etch resist.

In a preferred method of this invention an etchable plate is provided which has a coating on one surface thereof comprising a photoconductive insulating layer having a resinuous component. A latent electrostatic image is electrophotographically produced on the layer and developed with a toner comprising a mixture of thermoplastic particles and resin-curing catalytic particles. As described heretofore, the developed image is heat fused to the coating, and at the same time the coating is at least partially cured by the catalytic particles. Uncured coating material is removed and if desired, the remaining portion of the coating is further cured to provide an etch resist.

The invention also includes novel liquid developer compositions for use in the above methods. Thermoplastic electroscopic resin particles and separate catalytic powder particles are dispersed in an insulating liquid to form the developer compositions. When such compositions are applied to an electrostatic image, the resin particles and catalytic particles are attracted to and electrostatically held on the image. Upon heating, the resin particles become fused to the coating and the catalytic particles promote curing thereof.

Specific examples and additional advantages of the improved methods of this invention are included in the following detailed description.

In accordance with one method of this invention an etchable plate, such as, for example, magnesium, zinc, or copper has on its surface a resinous coating. A coating resin is selected which is capable of retaining an electrostatic charge and which includes molecular chains capable of being cross-linked at elevated temperatures in the presence of a suitable catalyst to provide on the plate an etch resist. A partial list of suitable resins includes the following: vinyl resins, silicones (or resinous polysiloxanes), phenolformaldehyde resins, polystyrenes, alkyd resins, amino resins, high styrene-butadiene resins, and compatible mixtures thereof. Some of the resins may be dried or cured in air or more rapidly by heat with a catalyst such as a peroxide or a lineolate, naphthanate, octoate, resinate, stearate or tallate of aluminum, cadmium, cobalt, copper, iron, lead, magnesium, manganese, zinc, or compatible mixtures thereof. Coating resins and catalysts therefor are more fully described in Organic Coating Technology, vol. 1, by Payne, Wiley and Sons Inc., New York, New York.

A latent electrostatic image may be produced on the resin coating, for example, by superimposing thereon a stencil and thereafter exposing the layer through the stencil to an ion producing source such as an array of corona generating wires. The electrostatic image so produced is then developed with finely divided electroscopic thermoplastic material. If the developer material has a triboelectric polarity different from the charge polarity of the electrostatic image, it will be attracted to the charges on the coating to produce thereon a direct or positive powder image. If the polarities are the same, the developer will be repelled by the charges and will deposit in uncharged areas to produce a reverse or negative powder image. Various other methods for producing and developing electrostatic images are described in "Electrofax" Direct Electrophotographic Printing on Paper, by C. J. Young and H. G. Greig, RCA Review, December 1954, vol. XV, No. 4.

Suitable developer materials include natural and synthetic resins or mixtures thereof which will comprise a solvent resist and which are compatible with the coating resin.

*Example I*

A developer powder may be prepared as follows. A mixture comprising 200 grams of 200 mesh Piccolastic resin 4358 (an elastic thermoplastic resin composed of polymers of styrene substituted styrene and its homologs) marketed by the Pennsylvania Industrial Co., Clairton, Pa., 12 grams of Carbon Black 6, marketed by the Eimer and Amend Co., New York, N.Y., 12 grams of spirit Nigrosine S.S.B., marketed by the Allied Chemical and Dye Co., New York, N.Y., and 8 grams of Isol Black, marketed by the Allied Chemical and Dye Co., New York, N.Y., are thoroughly mixed in a stainless steel beaker at about 200° C. The mixing and heating should be done in as short a time as possible. The melt is poured onto a brass tray and allowed to cool and harden. The hardened mix is then broken up and ball milled for about 20 hours. The melted powder is screened through a 200 mesh screen and is then ready for use as a developer powder. This powder takes on a positive electrostatic charge when mixed with carrier beads or iron powder as described in the aforesaid Young and Greig publication. It therefore develops an electrostatic image composed of negative charges.

Once the electrostatic image has been developed with the developer material it is then fixed to the resin coating. If the developer powder or the coating has a relatively low melting point, the image may be fixed by heating, for example, with an infra red lamp to fuse the powder to the coating. The powder image is preferably fused well into or through the coating. Sulphur or synthetic resin powders may be fixed in this way. Another method of fixing the powder image is to apply a light coating of a solvent for the material of the powder image. The solvent may soften the developer powder particles and cause them to adhere to one another and to the coating. Upon standing, and preferably with the application of a slight amount of heat, the solvent is evaporated from the printing base.

A solvent for the coating is now applied to the surface of the image carrying plate in order to remove the non-image areas of the coating while those areas of the coating having the fixed image thereon are left undisturbed. The solvent is a material which readily dissolves or softens the coating without attacking the fixed powder image. Suitable solvents for a silicone resin coating are methyl, ethyl, butyl or isoamyl alcohols and diacetone. Where the solvent merely softens the coating, a cotton swab, for example, dampened with the solvent is applied to the surface, wiping away the areas that have been softened. The selection of the composition of the coating, the developing powder and the solvent are interdependent upon one another. That is, the coating should comprise a dielectric, film-forming resin which is also soluble or softened by a selected solvent. The coating material must also contain molecular chains capable of being cross-linked in the presence of a suitable catalyst to provide a resist for an etch solution. The fixed powder image should be a material that is unaffected by the solvent for the coating.

Once the non-image areas of the coating have been removed, the remaining coating material is cured to provide an etch resist pattern on the plate. Curing is accomplished by applying a catalyst to the coating remaining on the plate. Preferably this is done by immersing the plate for a few seconds in a solution or dispersion containing the selected catalyst. Even though the coating material may be covered by a fused powder image, it has been found that the catalyst will contact the coating material sufficiently to promote the cross-linking reaction. Such contact may result from catalytic material reaching the coating by penetrating the superimposed powder image or solely from penetration into the edges of the coating pattern. With many materials, curing can be accomplished at ordinary room temperatures with a catalyst. However, with nearly all coating materials, curing is appreciably accelerated by heating the plate when the catalytic material is applied thereto. For example, a coating pattern of resinous polysiloxane can be converted into an etch resist by immersion in an aluminum octoate dispersion for a few seconds and then heating the plate for about one minute at a temperature of 300 to 400 degrees Fahrenheit.

Once curing of the coating pattern is completed and the non-image areas of the coating removed, the plate is ready for etching with a standard etch solution. In the preparation of a printing plate, etching is continued until the desired depth is attained. In the preparation of a printed circuit, the plate to be etched comprises a metal layer bonded to a dielectric base and etching is continued until all metal in non-image areas on the dielectric base is removed. From the foregoing description it is obvious that this invention is equally adapted for preparing plates other than printing plates and printed circuits. Ornamental plaques and name plates are examples of such other plates.

In the preferred methods of this invention, electrophotographic processes such as are described in the aforementioned Young and Greig publication are employed. In such processes, an etchable plate is provided which has on one surface thereof a photoconductive insulating coating which includes a cross-linkable resin component. As described in the above publication, one such coating comprises a photoconductive zinc oxide dispersed in a resin binder. Other suitable photoconductors are described in U.S. Patent 2,862,815 to M. L. Sugarman and A. J. Moncrieff-Yeates. The requirements with respect to the resin component for such a photoconductive coating are substantially the same as those for the insulating coating resin earlier described herein. Such a resin component should be one in which a finely divided photoconductor is easily dispersed and such as to provide a stable dispersion in the final coating. It is essential that the resin be a good insulator and that it have molecular chains which can be cross-linked in the presence of a selected catalyst.

In the electrophotographic processing of a plate having a photoconductive coating, it is usually convenient to first provide on the coating a uniformly distributed electrostatic charge. Such a charge may be produced by passing over the coating a corona generating device comprising an array of fine wires connected to a source of high potential.

Once the coating is charged, it is then exposed to a light image. Exposure may be made by conventional contact printing or projection techniques. Exposure to the light image produces on the coating a latent electrostatic image, the charged areas of which correspond to the dark areas of the original light image.

The latent electrostatic image may be developed into a powder image, as described heretofore, or, in the alternative, development may be accomplished by liquid development techniques. Such techniques may include applying to an electrostatic image a dispersion comprising a finely divided thermoplastic resin toner dispersed in an insulating liquid. For use in the foregoing method, the toner is selected to be substantially insoluble in a solvent for the uncured binder resin in the photoconductive coating.

A preferred liquid developer composition comprises thermoplastic resin particles and separate catalytic powder particles dispersed in an insulating carrier liquid. A pigmented resin such as that of Example I may be employed as well as other thermoplastic particles which need not be insoluble in the selected solvent for the coating.

A catalytic powder is selected which will not dissolve in the carrier liquid. The resin particles and catalytic particles may be added to the carrier liquid separately but preferably the particles are ground or ball milled together before being added to the carrier liquid to form therein a dispersion of very fine particles. In either case, for each part by weight of resin particles, one to four or more parts by weight of catalytic material preferably should be employed.

*Example II*

4 parts by weight aluminum octoate (or aluminum stearate).

1 part by weight pigmented resin of Example I.

5 ounces of these two materials are ball milled together for up to 200 hours in 1 pint of dimethyl polysiloxane (2.0 centistokes) to form a developer concentrate. Such a concentrate preferably comprises up to 20% by weight of the two particulate materials. A carrier liquid is then prepared comprising:

1 part by volume dimethyl polysiloxane (0.6 to 3.0 centistokes).

1 part by volume trichlorotrifluoroethane.

25 milliliters of the developer composition is then thoroughly dispersed into one quart of the carrier liquid to form the liquid developer composition.

The latent electrostatic image previously produced on the photoconductive coating is developed into a powder image and the latter is fused to the photoconductive coating as described heretofore. With the above mentioned liquid developer composition, curing of the resin in the coating can be initiated or completed during fusing of the developer particles to the photoconductive coating.

Curing initiated or completed in this manner substantially improves the results of subsequent processing. It has been found that, when a solvent for the resin in the coating is applied to the coating to remove the non-image areas thereof, any risk of undercutting in image areas is substantially obviated. This result can be obtained even though the solvent may remove some or all of the pigmented resin of the fused image.

If curing of the resin component has only been initiated during the above fusing step, further curing is provided for by additional processing steps. After non-image areas have been removed with a solvent, catalytic material is again applied to the image areas on the plate. This may be accomplished, for example, by immersing the plate in a dispersion of catalytic powder in the same carrier liquid employed in producing the developed powder image. Finally, the plate is heated to the curing temperature to complete the conversion of the photoconductive coating remaining thereon into an etch resist and thus ready the plate for etching.

What is claimed is:

1. A method of processing an etchable plate having on one surface thereof an insulating resinous layer which is soluble in a selected solvent and is capable of being cured with a selected catalyst when heated; said method comprising the steps of: producing a latent electrostatic image on the surface of said resinous layer; developing said electrostatic image into a powder image with a finely-divided thermoplastic electroscopic material which is insoluble in said selected solvent; fusing said powder image to said resinous layer; applying said selected solvent to said resinous layer to remove all portions thereof not covered by said powder image; applying said catalyst to said powder image; and, heating said plate to cure the portions of said resinous layer underlying said powder image to convert said portions into an etch resist.

2. The method of claim 1 including the additional step of etching said plate to a desired depth.

3. The method of claim 1 wherein said plate comprises a metal layer bonded to an insulating base; said method including the additional step of etching away all portions of said metal layer not covered by said etch resist to leave a conductive pattern on said insulating base.

4. A method of processing on an etchable surface having a coating thereon comprising a photoconductive insulating material having a resinous component soluble in a selected solvent and capable of being catalytically cured; said method comprising the steps of; electrophotographically producing a latent electrostatic image on said coating; developing said electrostatic image with a finely-divided thermoplastic material which is insoluble in said selected solvent; fusing said thermoplastic material to said coating; applying said selected solvent to said coating to remove all portions thereof not covered by said thermoplastic material; applying to the remaining thermoplastic material and coating a curing catalyst for the resinous component of said coating; and heating said coating to produce on said surface a cured etch resist.

5. The method of claim 4 wherein said etch resist is produced on the surface of a metal layer bonded to an insulating base and all portions of said metal layer not covered by said resist are etched away to provide a conductive pattern on said insulating base.

6. The method of claim 4 wherein said etch resist is produced on the surface of a raw printing plate and all areas on said plate not covered by said resist are etched to a desired depth.

7. The method of claim 4 wherein said curing catalyst is applied by immersing said surface in a catalyst solution.

8. A method of processing an etchable plate having on one surface thereof a coating comprising a resinous layer which is soluble in a selected solvent and is capable of being cured with a selected catalyst when heated; said method comprising the steps of: producing a latent electrostatic image on the surface of said coating; developing said electrostatic image into a powder image with a powdered thermoplastic material including said selected catalyst, heating said plate with said powder image thereon to cause said powder image to fuse to said coating and to render the underlying coating insoluble in said selected solvent; applying said solvent to said coating to remove all portions thereof which have not been rendered insoluble; again applying a catalytic material to said plate bearing said insoluble coating; and again heating said plate to further cure said insoluble coating and to convert said coating into an etch resist.

9. The method of claim 8 wherein said coating comprises a photoconductive insulating layer having a resinous component which is soluble in said selected solvent and is capable of being cured with said selected solvent when heated, and said electrostatic image is electrophotographically produced on the surface of said coating.

10. The method of claim 8 wherein said etch resist is produced on the surface of a raw printing plate and all areas on said plate not covered by said resist are etched to a desired depth.

11. The method of claim 8 wherein said etch resist is produced on the surface of a metal layer bonded to an insulating base and all portions of said metal layer not covered by said resist are etched away to provide a conductive pattern on said insulating base.

12. The method of claim 8 wherein said electrostatic image is developed by immersing said plate in a dispersion of said powdered material in an insulating liquid.

13. The method of claim 12 wherein after said powdered material is fused to said coating said plate is again immersed in said dispersion to again apply catalytic material to said plate bearing said insoluble coating.

14. A method of processing an etchable plate having on one surface thereof a photoconductive insulating coating comprising a finely-divided photoconductor dispersed in a resinous material which is soluble in a selected solvent and is capable of being cured with a selected catalyst when heated; said method comprising the steps of:

electrophotographically producing a latent electrostatic image on the surface of said coating;

developing said electrostatic image into a powder image of powdered thermoplastic material and powdered catalytic material by applying to said coating a developer composition comprising said powdered thermoplastic material and separate particles of said powdered catalytic material dispersed in an insulating liquid;

heating said coating with said powder image thereon to fuse said powdered thermoplastic material thereto and promote curing of the resinous material of said coating underlying said powdered catalytic material; and applying said selected solvent to said coating to remove all portions thereof not covered by said powder image to provide a resist pattern on said plate; and etching all areas on said plate not covered by said coating to a desired depth.

15. The method of claim 1 wherein said insulating resinous layer comprises a resinous polysiloxane and said catalyst is selected from the class consisting of aluminum octoate, aluminum stearate and mixtures thereof.

16. The method of claim 1 wherein said resinous component comprises a resinous polysiloxane and said catalyst is selected from the class consisting of aluminum octoate, aluminum stearate and mixtures thereof.

17. The method of claim 8 wherein said resinous layer comprises a resinous polysiloxane and said catalyst is selected from the class consisting of aluminum octoate, aluminum stearate and mixtures thereof.

18. The method of claim 14, wherein said resinous material comprises a resinous polysiloxane and said catalyst is selected from the class consisting of aluminum octoate, aluminum stearate and mixtures thereof.

References Cited by the Examiner

UNITED STATES PATENTS

| | | | |
|---|---|---|---|
| 2,410,737 | 11/46 | Jenny | 260—46.5 |
| 2,455,936 | 12/48 | Lowe | 117—62.2 |
| 2,579,332 | 12/51 | Nelson | 260—37 |
| 2,857,271 | 10/58 | Sugarman | 96—1 |
| 2,946,682 | 7/60 | Lauriello | 96—1 |
| 2,965,573 | 12/60 | Gundlach | 252—62.1 |
| 2,979,403 | 4/61 | Giaimo | 96—1 |
| 2,982,647 | 5/61 | Carlson et al. | 96—1 |
| 2,986,521 | 5/61 | Wielicki | 252—62.1 |
| 3,029,145 | 4/62 | Dumers et al. | 96—115 |
| 3,041,195 | 6/62 | Saewart et al. | 117—62 |
| 3,060,019 | 10/62 | Johnson et al. | 96—1 |
| 3,082,181 | 3/63 | Brown et al. | 260—37 |

FOREIGN PATENTS

| | | |
|---|---|---|
| 210,374 | 9/57 | Australia. |

NORMAN G. TORCHIN, *Primary Examiner.*

MILTON STERMAN, *Examiner.*